United States Patent [19]

Meyer

[11] Patent Number: 5,671,184

[45] Date of Patent: Sep. 23, 1997

[54] SEMICONDUCTOR MEMORY WITH CELLS COMBINED INTO INDIVIDUALLY ADDRESSABLE UNITS, AND METHOD FOR OPERATING SUCH MEMORIES

[75] Inventor: Willibald Meyer, Munich, Germany

[73] Assignee: Siemens Aktiengesellschaft, Munich, Germany

[21] Appl. No.: 610,047

[22] Filed: Mar. 4, 1996

[30] Foreign Application Priority Data

Mar. 2, 1995 [DE] Germany ............. 195 07 312.6

[51] Int. Cl.$^6$ ............................................. G11C 8/00
[52] U.S. Cl. .............. 365/200; 365/225.7; 365/230.03; 365/230.06
[58] Field of Search .................... 365/200, 230.03, 365/230.06, 225.7, 148, 230.01

[56] References Cited

U.S. PATENT DOCUMENTS

| | | | |
|---|---|---|---|
| 5,446,692 | 8/1995 | Haraguchi et al. | 365/200 |
| 5,457,655 | 10/1995 | Savignac et al. | 365/200 |
| 5,461,587 | 10/1995 | Oh | 365/200 |
| 5,493,531 | 2/1996 | Pascucci et al. | 365/200 |
| 5,517,450 | 5/1996 | Ohsawa | 365/200 |
| 5,544,106 | 8/1996 | Koike | 365/200 |

FOREIGN PATENT DOCUMENTS

| | | |
|---|---|---|
| 1251252 | 3/1989 | Canada . |
| 3538452 | 6/1986 | Germany . |

OTHER PUBLICATIONS

"Designing static RAMs for yield as well as speed", Sud et al., Electronics, Jul. 1981, pp. 121–126.

*Primary Examiner*—Do Hyun Yoo
*Attorney, Agent, or Firm*—Herbert L. Lerner; Laurence A. Greenberg

[57] ABSTRACT

Memory cells of a semiconductor memory are combined into individually addressable units. An address decoding circuit connects to the units. A programmable address transformation configuration is connected between address terminals receiving external address signals and the decoding circuit. The address transformation configuration, in its unprogrammed state, outputs an internal address signal at each of the outputs which corresponds to the external address signal present at a corresponding one of the address terminals. In its programmed state it outputs an internal address signal at at least one of said outputs, which differs from the external address signal present at a corresponding one of the inputs. The units are thus readdressed relative to the external address. The semiconductor memory is operated by applying external address signals for addressing the units at the address terminals; the external address signals are transformed in an address transformation to become internal address signals within the semiconductor memory. The internal address is fed to the address decoding circuit instead of the external address signals. The address transformation is processed in such a way that, upon application of a first address with a predetermined address value to the address terminals, a different unit is addressed than when the external address were applied without carrying out the address transformation.

14 Claims, 2 Drawing Sheets

SEMICONDUCTOR MEMORY WITH CELLS COMBINED INTO INDIVIDUALLY ADDRESSABLE UNITS, AND METHOD FOR OPERATING SUCH MEMORIES

BACKGROUND OF THE INVENTION

Field of the Invention

The invention relates to a a semiconductor memory with memory cells which are combined into individually addressable units, and which has an address decoding circuit connected to the units. The semiconductor memory has address terminals to which external address signals can be applied for addressing the units via the address decoding circuit. The external address signals form an external address. The invention also pertains to a method for operating such memories, in which at least one unit contains defective memory cells whose number or arrangement unfavorably affect an operation of the semiconductor memory.

The usefulness of semiconductor memories for specific applications is determined above all by whether the semiconductor memories have defective memory cells, or by the number and/or spatial distribution of such defective cells. In manufacturing semiconductor memories, it is generally impossible to attain a memory in which none of the memory cells will be defective.

It is true that applications exist, for instance in the audio field, for which an entirely intact memory is not necessary. Even in those cases, however, only a limited number of defective memory cells is acceptable. There are also limitations in terms of the local accumulation of defective memory cells.

The primary goal in semiconductor memory manufacture is to produce semiconductor memories that meet even the most stringent quality demands, as is needed for instance for computer memories.

In order to meet the aforementioned goals of acceptable frequency or density of defects or to achieve an entirely defect-free memory, it has been known heretofore to provide redundant word lines and/or redundant bit lines. If the presence of defective memory cells is detected in a test procedure following the production of the semiconductor memory, then these redundant lines can replace normal word or bit lines that have defective memory cells.

Bit lines, word lines and memory blocks are units of memory cells each of which are individually addressable by means of line, column and block addresses, respectively.

Since furnishing redundant units of memory cells involves effort and hence expense for circuitry, their number is limited. It is therefore possible that even if all the existing redundant units are used, more defective memory cells will still be present, which do not allow the memory to be used as intended.

SUMMARY OF THE INVENTION

It is accordingly an object of the invention to provide a semiconductor memory with cells combined into individually addressable units, and method for operating such memories, which overcomes the above-mentioned disadvantages of the heretofore-known devices and methods of this general type and which provides a semiconductor memory and a method in which improved usability of the memory is possible even when defective memory cells are present.

With these and other objects in view there is provided, in accordance with the invention, a semiconductor memory, comprising:

a plurality of memory cells combined into individually addressable units;

an address decoding circuit connected to the units;

a plurality of address terminals for receiving external address signals for addressing the units via the address decoding circuit, wherein the external address signals define an external address;

a programmable address transformation configuration connected between the address terminals and the address decoding circuit; the address transformation configuration having a programmed state and an unprogrammed state, and having inputs each connected to a respective one of the address terminals;

the address transformation configuration having outputs connected to the address decoding circuit, each of the outputs corresponding to a respective one of the inputs;

the address transformation configuration, in its unprogrammed state, outputting an internal address signal at each of the outputs which corresponds to the external address signal present at a corresponding one of the inputs, and the internal address signal representing an internal address;

the address transformation configuration, in its programmed state, outputting an internal address signal at at least one of the outputs, which differs from the external address signal present at a corresponding one of the inputs, for readdressing the units relative to the external address.

The individually addressable units, which have a plurality of memory cells, may by way of example be memory blocks or bit or word lines.

By the transformation of the external addresses applied to the address terminals, it is possible for defective units of memory cells to be exchanged in terms of their address for intact units, in such a way as to create the largest possible memory region that is coherently addressable by external addresses. The operation of the memory may then be limited to the intact memory region. This solution offers the advantage that either fewer redundant units are required in order to attain the same yield as in prior art semiconductor memories, or that with the same number of redundant units, the attainable yield is improved.

Memories in which the address transformation according to the invention is carried out have a memory capacity that is reduced by the number of units having defective memory cells, compared with corresponding memories having intact units.

In accordance with an added feature of the invention, the address transformation configuration is programmable such that at least one of the outputs carries an internal address signal which is inverted relative to the external address signal present at a corresponding one of the inputs.

In accordance with an additional feature of the invention, the address transformation configuration includes one XNOR gate and one recoding unit per address terminal; the recoding unit has an output selectively carrying a first potential and a second potential of the semiconductor memory, in dependence on the programming state of the address transformation configuration; the XNOR gate includes a first input being one of the inputs of the address transformation configuration; the XNOR gate includes a second input connected to the output of the recoding unit; and the XNOR gate includes an output being a respective output of the address transformation configuration.

In accordance with another feature of the invention, each of the recoding units has a series circuit connected between the first potential and the second potential; the series circuit has a first programmable element F1 and a resistor mutually connected in series; and the output of the recoding unit is a node between the first programming element and the resistor.

In accordance with a further feature of the invention, the address transformation configuration, in the programmed state thereof, interchanges the internal address signals at at least two of the outputs as compared with the unprogrammed state thereof.

In accordance with again an added feature of the invention, the semiconductor memory further comprises second programmable elements connected between the inputs and the respectively corresponding outputs, the second programmable elements, in the nonprogrammed state, bypass the address transformation configuration.

In accordance with again an additional feature of the invention, the address transformation configuration is reversibly programmable. It should be noted, however, that the address transformation configuration can be embodied such that its programming can be done either reversibly or irreversibly. In the case of reversible programming, it is possible for the address transformation configuration to reprogram later if further memory cells fail. The result is that once again an optimized (although now smaller) memory region is available for use.

In accordance with further features, the units are memory blocks, and the address decoding circuit is a block decoding circuit; or the units are bit lines, and the address decoding circuit is a bit address decoding circuit; or the units are word lines, and the address decoding circuit is a word address decoding circuit.

With the above and other objects in view, there is also provided, in accordance with the invention, a method of operating the above-noted semiconductor memory with memory cells combined into addressable units (of which at least one contains defective memory cells unfavorably affecting an operation of the semiconductor memory). The method comprises: applying external address signals for addressing the units at the address terminals via the address decoding circuit, for forming an external address; transforming the external address signals to internal address signals for generating an internal address within the semiconductor memory; supplying, to the address decoding circuit, the internal address signals instead of the external address signals; wherein the transforming step comprises transforming the external address in such a way that, upon application of a first address with a predetermined address value to the address terminals, a different unit is addressed than when the external address were applied without carrying out the transforming step.

In accordance with an added mode of the invention, the transforming step is performed such that an address of the unit with defective memory cells is disposed in a peripheral region of a logical address space formed by possible combinations of the external addresses. It is especially advantageous if, as a result of the transformation, the units with defective memory cells are disposed in the peripheral region of the logical address space. Then the other units can be used especially simply, since they are externally addressable as memory regions that are contiguous in terms of their address. In this way, it is possible for instance for the coherent, defect-free memory region to begin at the external address of 0. This is equivalent to how addressing is typically done in conventional applications.

In accordance with a concomitant mode of the invention, the semiconductor memory includes a redundant unit (e.g. a redundant word line, a redundant bit line) which is activatable for replacing one of the units, and the method further comprises: prior to the transforming step, activating the redundant unit and replacing the unit with the defective memory cells; and subsequently transforming an external address of a further unit with defective memory cells.

The invention makes it possible, at a predetermined external address, to address a unit with intact memory cells rather than addressing a unit with defective memory cells. The latter case would happen without address transformation. The internal addresses of the units remain unchanged in the process.

The address transformation can be carried out in an especially simple fashion as follows: At least one of the external address signals is inverted by the address transformation configuration internally in the memory. In this way it can be ascertained at which external address a particular unit will be addressed.

An especially large usable address space of the semiconductor memory is obtained if, before the address transformation according to the invention is carried out, units with defective memory cells are replaced with corresponding redundant units. The address transformation is then carried out only for the lower number of still-existing units having defective memory cells. By proceeding in this way, it is possible to increase the yield attainable by using the redundant units still further.

Other features which are considered as characteristic for the invention are set forth in the appended claims.

Although the invention is illustrated and described herein as embodied in a semiconductor memory with cells combined into individually addressable units, it is nevertheless not intended to be limited to the details shown, since various modifications and structural changes may be made therein without departing from the spirit of the invention and within the scope and range of equivalents of the claims.

The construction and the method of the invention, however, together with additional objects and advantages thereof will be best understood from the following description of the specific embodiment when read in connection with the accompanying drawings.

DESCRIPTION OF THE PREFERRED EMBODIMENTS

Figure 1:
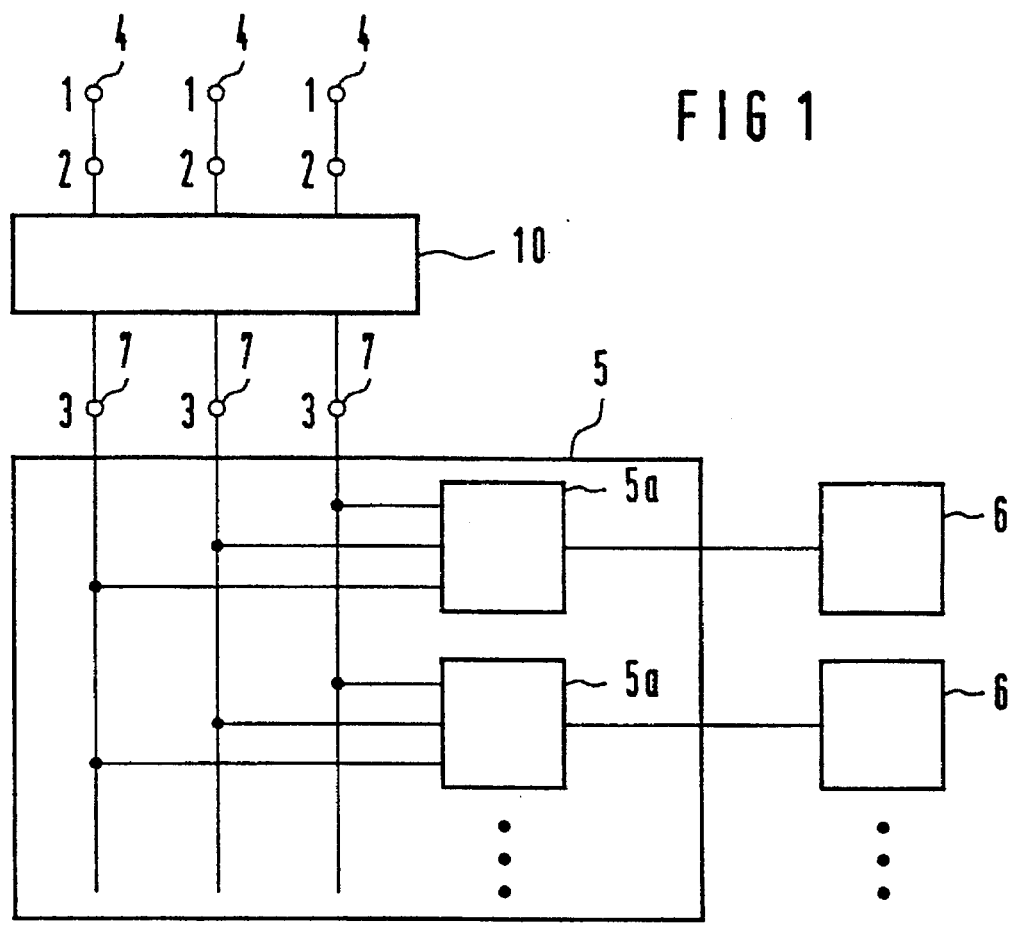
FIG. 1 is a schematic view of a semiconductor memory according to the invention.

Referring now to the figures of the drawing in detail and first, particularly, to FIG. 1 thereof, there are illustrated only the essential components with regard to the invention. The illustrated semiconductor memory has individually addressable units 6 that have a number of memory cells. The units 6 may be either bit lines, word lines, or memory blocks of the semiconductor memory. Other components, such as drivers and buffers, that are typically present are not illustrated for clarity.

There is shown a programmable address transformation configuration 10 with inputs 2 and outputs 3. One of the inputs 2 is assigned to each output 3. The inputs 2 are each connected to a respective address terminal 1 of the semiconductor memory, to which external address signals 4 can be applied.

All the external address signals 4 which are simultaneously applied at the address terminals 1 form an external address of the semiconductor memory. The units 6 are addressable via an address decoding circuit 5 connected to the outputs 3. If the units 6 are memory blocks, then the address decoding circuit 5 is a block decoding circuit. If the units 6 are bit or word lines, then the address decoding circuit 5 is a bit address or word address decoding circuit.

The structure of the address decoding circuit 5 does not matter to the invention. By way of example, it may be embodied in multiple stages or may perform the address decoding centrally and activate the addressed units 6 directly. It may also have a plurality of decentralized address decoders 5a, as shown in FIG. 1, each of which is assigned and connected to one unit 6 and on the other hand is connected to all the outputs 3. Such an embodiment is involved for instance if the units 6 are memory blocks and one block decoder, in the form of an address decoder 5a, is assigned to each of the memory blocks.

The address transformation configuration 10 is embodied such that in the unprogrammed state, it carries external address signals 4, which are present at the inputs 2, in the form of internal address signals 7 to the corresponding outputs 3. Thus the address decoding circuit 5 receives the external addresses, applied to the address terminals 1, in unchanged form as internal addresses as well. If in a memory test defective memory cells are found in at least one of the units 6 which are unacceptable in number or distribution for an intended use of the memory, then the transformation configuration 10 can be programmed in such a way that, instead of the external address present at the address terminals 1, its outputs 3 carry as an internal address a predeterminable other internal address. That other internal address is derived from the external address. For that purpose, it suffices for an internal address signal 7 that differs from the external address signal 4 applied to the corresponding input 2 to be generated by the address transformation configuration 10 at at least one of its outputs 3. Thus the location of a unit 6 with defective memory cells within the logical address space of the semiconductor memory can be changed in a purposeful way.

It is especially favorable if the programming of the address transformation configuration 10 produces a value, for the unit 6 with defective memory cells, of its associated external address that is within the peripheral region of the logical address space of the semiconductor memory. Thus a maximum coherently addressable address space with units 6 that are acceptable for the intended use of the memory is attainable.

In many cases, the address transformation of the unit 6 with defective memory cells will mean that some or all of the intact units 6 are also readdressed. But this is not important.

If a plurality of units 6 have defective memory cells, then it is possible, by using suitable algorithms, to find out which programming of the address transformation configuration 10, for the selected embodiment of the address transformation configuration 10, will shift all the units 6 having defective memory cells as far as possible into the peripheral region of the address space. The address transformation configuration 10 should then be programmed accordingly.

Figure 2:
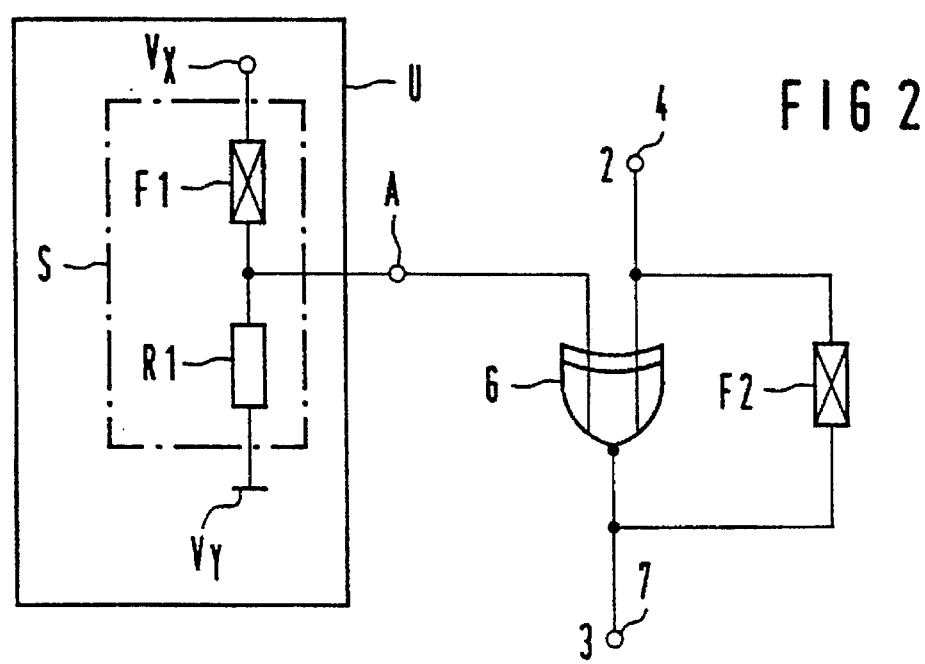
FIGS. 2–4 are partial views of exemplary embodiments of an address transformation configuration according to the invention.

FIG. 2 shows a portion of an exemplary embodiment of the address transformation configuration 10. In this exemplary embodiment, identical arrangements are contemplated for all the inputs 2 and the associated outputs 3 of the address transformation configuration 10. An XNOR gate G is shown, whose first input is one of the inputs 2 of the address transformation configuration 10. The output of the XNOR gate G is the associated output 3 of the address transformation configuration 10.

A second input of the XNOR gate G is connected to an output A of a recoding unit U. In this exemplary embodiment, the recoding unit U has a series circuit S between a first potential Vx and a second potential Vy of the semiconductor memory. The first potential Vx may for instance be a supply potential applied externally to the semiconductor memory or an internally generated supply potential. The second potential Vy may be a reference potential, such as ground, for instance. The series circuit S has a programmable first element F1, connected to the first potential Vx, and a resistor R1 connected to the second potential. The first element F1 and the resistor R1 are connected through a node which forms the output A of the recoding unit U. In the unprogrammed state of the address transformation configuration 10, the first element F1 connects the first potential Vx to the output A of the recording unit U, so that in the XNOR gate G, the internal address signal 7 at the output 3 corresponds to the external address signal 4 at the corresponding input 2. In programming of the address transformation configuration 10, the first element F1 is programmed, that is, the connection between the output A of the recording unit U and the first potential Vx is interrupted. The result is that essentially the second potential Vy is present at the output A. The internal address signal 7 at the output 3 of the XNOR gate G is thus inverse to the external address signal 4 at the input 2.

The input 2 and the output 3 of the exemplary embodiment in FIG. 2 are additionally connected by means of an optional, programmable second element F2, which short-circuits the XNOR gate G and thus this portion of the address transformation configuration 10. The second element F2 is likewise an interruptible connection. In the case where the address transformation configuration 10 is not programmed, the second element F2 is not interrupted. In that state, the effect of the gate transit time of the XNOR gate G is suppressed. In this exemplary embodiment, the second element F2 is programmed, or in other words interrupted, when the first element F1 is programmed, and as a result its short-circuiting action is cancelled.

The first element F1 and the second element F2 may for example be break points intended to be opened by means of a laser or electrically. Such break points are commonly called "fuses".

For all the external addresses, the result of the transformation is internal addresses that are altered compared with the nonprogrammed state. Thus in terms of the external addresses, all the other units 6 are readdressed, except for the unit 6 having defective memory cells. As long as the other units 6 are intact, this is of no consequence.

If there are many units 6 with defective memory cells, then optimal programming, for the sake of the largest possible intact address space to be produced, must be accomplished by means of suitable algorithms. Developing such algorithms presents no difficulty to one skilled in the art, however.

Figure 3:
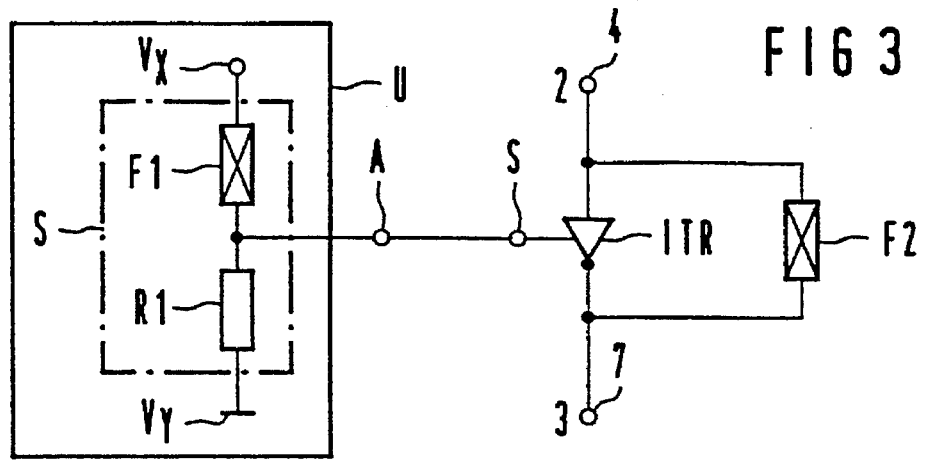

With reference to FIG. 3, an inverter ITR with a tristate output can be used in common with the second element F2 instead of the XNOR gate G in FIG. 2. The inverter ITR has a control input S that is connected to the output A of the recoding unit U. Without programming of the transformation configuration 10, the first potential Vx is present at the output A of the recoding unit U. It puts the tristate inverter ITR into a high-impedance state. The output 3 and the input 2 of the transformation configuration 10 are connected via the second element F2. If the internal address signal 7 is now to be inverted (relative to the external address signal 4), then the first element F1 and the second element F2 are programmed. The tristate inverter ITR then functions like a conventional inverter, and its bypassing is cancelled.

Figure 4:
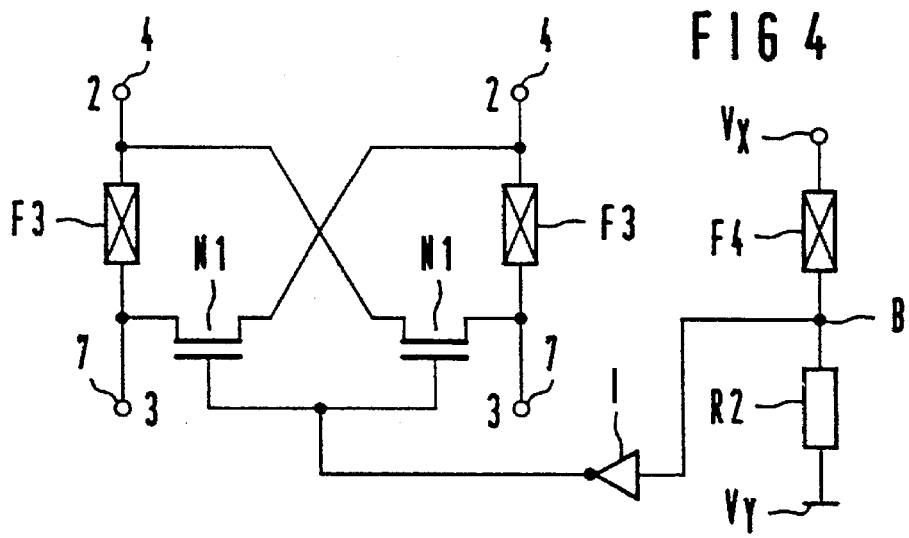

FIG. 4 shows a detail of an exemplary embodiment of the address transformation configuration 10, in which the association of at least two of its outputs 3 with the corresponding inputs 2 is transposed by way of programming. Two of the inputs 2 are shown along with the two associated outputs 3 with which they are connected via third programmable elements F3. In addition, each of the inputs 2 is connected to the output 3 of the other input 2 via the channel path of an n-channel field effect transistor N1. The gates of the field effect transistors N1 are connected to one another and to one output of an inverter I. One input of the inverter I is connected to a circuit node B between a fourth programmable element F4 and a second resistor R2. The fourth element F4 and the resistor R2 form a series circuit between the first potential Vx and the second potential Vy, with the node B therebetween.

If the internal address signals 7 at the outputs 3 are now to be transposed, then the address transformation configuration 10, the third element F3 and the fourth element F4 are opened by programming.

Figure 5:
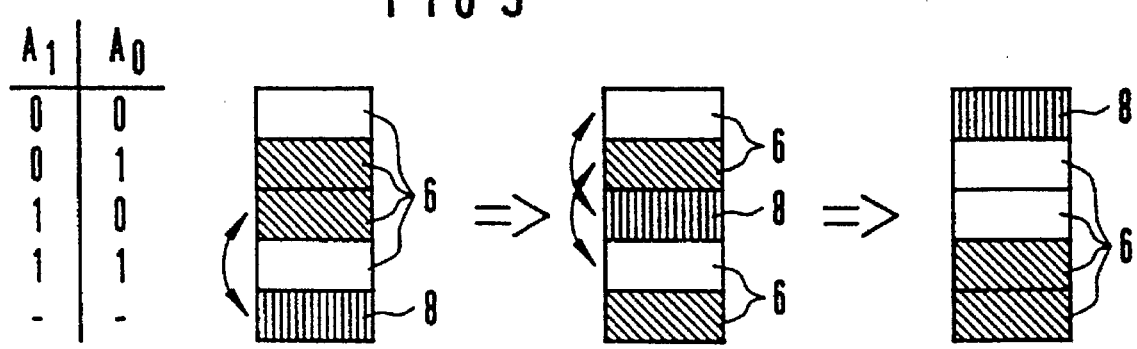
FIG. 5 is a schematic illustration of the method of the invention.

FIG. 5 refers to the method of the invention in terms of an exemplary embodiment, in which the semiconductor memory has four units 6 and one redundant unit 8, which are addressable by the combination of two external address signals 4 (marked A0 and A1 in the drawing). The left-hand part of FIG. 5 shows the external addressing of the units 6 and of the redundant unit 8 before the address transformation according to the invention is carried out. The units 6 with the addresses A1A0=01 and A1A0=10 have defective memory cells. The redundant unit 8 is initially not activated, and no external address is assigned to it.

The middle part of FIG. 5 shows the external addressing of the units 6 and the redundant unit 8, after the unit 6 with defective memory cells, which in the left-hand part of FIG. 5 has the third-lowest external address A1A0=10, has been replaced by the redundant unit 8.

The right-hand part of FIG. 5 shows the external addressing of the units 6 and of the redundant unit 8, after the address transformation according to the invention has been carried out, following the activation of the redundant unit 8, in such a way that the unit 6 with the defective memory cells, which previously had the second-lowest address A1A0=01, has been transposed in terms of its address with the unit 6 having the highest address A1A0=11. In this exemplary embodiment, the address transformation is done by inverting the highest address signal 4, which is indicated as A1 in FIG. 5. Such an inversion can be done for instance by means of the exemplary embodiments of the address transformation configuration 10 shown in FIG. 2 and FIG. 3.

The three parts of FIG. 5 illustrate the logical address space of the memory. Once the transformation has been carried out, the redundant unit 8 with the new external address 00 and the units 6 with the new external addresses 01 and 10 form a contiguous, externally addressable memory region with no defective memory cells.

I claim:

1. A semiconductor memory, comprising:

a plurality of memory cells combined into individually addressable units;

an address decoding circuit connected to the units;

a plurality of address terminals for receiving external address signals for addressing said units via said address decoding circuit, wherein the external address signals define an external address;

a programmable address transformation configuration connected between said address terminals and said address decoding circuit; said address transformation configuration having a programmed state and an unprogrammed state, and having inputs each connected to a respective one of said address terminals;

said address transformation configuration having outputs connected to said address decoding circuit, each of said outputs corresponding to a respective one of said inputs;

said address transformation configuration, in its unprogrammed state, outputting an internal address signal at each of said outputs which is the same as the external address signal present at a corresponding one of said inputs, and the internal address signal representing an internal address;

said address transformation configuration, in its programmed state, outputting an internal address signal at at least one of said outputs, which differs from the external address signal present at a corresponding one of said inputs, for readdressing said units relative to the external address, such that an address of a defective one of said units is disposed in a peripheral region of a logical address space formed by possible combinations of the external address.

2. The semiconductor memory according to claim 1, wherein said address transformation configuration is programmable such that at least one of said outputs carries an internal address signal which is inverted relative to the external address signal present at a corresponding one of said inputs.

3. The semiconductor memory according to claim 1, wherein said address transformation configuration includes one XNOR gate and one recoding unit per address terminal;

said recoding unit has an output selectively carrying a first potential and a second potential of the semiconductor memory, in dependence on the programming state of said address transformation configuration;

said XNOR gate includes a first input being one of said inputs of said address transformation configuration;

said XNOR gate includes a second input connected to said output of said recoding unit; and said XNOR gate includes an output being a respective output of said address transformation configuration.

4. The semiconductor memory according to claim 3, wherein each of said recoding units has a series circuit connected between the first potential and the second potential; said series circuit having a first programmable element and a resistor mutually connected in series; and the output of said recoding unit being formed by a node between said first programmable element and said resistor.

5. The semiconductor memory according to claim 1, wherein said address transformation configuration, in the programmed state thereof, interchanging the internal address signals at at least two of said outputs as compared with the unprogrammed state thereof.

6. The semiconductor memory according to claim 1, which further comprises programmable elements connected between said inputs and said respectively corresponding outputs, said programmable elements, in the unprogrammed state, bypassing said address transformation configuration.

7. The semiconductor memory according to claim 1, wherein said address transformation configuration is reversibly programmable.

8. The semiconductor memory according to claim 1, wherein said units are memory blocks, and said address decoding circuit is a block decoding circuit.

9. The semiconductor memory according to claim 1, wherein said units are bit lines, and said address decoding circuit is a bit address decoding circuit.

10. The semiconductor memory according to claim 1, wherein said units are word lines, and said address decoding circuit is a word address decoding circuit.

11. A method of operating a semiconductor memory with memory cells combined into addressable units, of which at least one unit contains defective memory cells unfavorably affecting an operation of the semiconductor memory, the method comprising the steps:

providing address terminals of the semiconductor memory and an address decoding circuit;

applying external address signals for addressing the units at the address terminals via the address decoding circuit, for forming an external address;

transforming the external address signals to internal address signals for generating an internal address within the semiconductor memory;

supplying, to the address decoding circuit, the internal address signals instead of the external address signals;

wherein the transforming step comprises the substep of transforming the external address in such a way that, upon application of a first address with a predetermined address value to the address terminals, a different unit is addressed than when the external address was applied without carrying out the transforming step; and wherein the transforming step is performed such that, subsequently to the address transformation, an address of a defective one of the addressable units is disposed in a peripheral region of a logical address space formed by possible combinations of the external address.

12. The method according to claim 11, wherein the semiconductor memory includes a redundant unit which is activatable for replacing one of the units, and the method further comprises the steps: prior to the transforming step, activating the redundant unit and replacing the unit with the defective memory cells; and subsequently transforming an external address of a further unit with defective memory cells.

13. The method according to claim 12, wherein the redundant unit is a redundant word line.

14. The method according to claim 12, wherein the redundant unit is a redundant bit line.

* * * * *